United States Patent
Karashima et al.

(10) Patent No.: US 9,728,487 B2
(45) Date of Patent: Aug. 8, 2017

(54) SEMICONDUCTOR DEVICE

(71) Applicant: Renesas Electronics Corporation, Tokyo (JP)

(72) Inventors: Takashi Karashima, Gunma (JP); Yumi Imamura, Gunma (JP); Yosuke Imazeki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/095,033

(22) Filed: Apr. 9, 2016

(65) Prior Publication Data
US 2016/0343755 A1  Nov. 24, 2016

(30) Foreign Application Priority Data

May 19, 2015 (JP) ................................. 2015-101542

(51) Int. Cl.
*H01L 23/34* (2006.01)
*H01L 21/00* (2006.01)
(Continued)

(52) U.S. Cl.
CPC ............. *H01L 23/40* (2013.01); *H01L 23/055* (2013.01); *H01L 23/36* (2013.01); *H01L 23/38* (2013.01); *H01L 23/4093* (2013.01); *H01L 23/49805* (2013.01); *H01L 23/10* (2013.01); *H01L 23/49816* (2013.01); *H01L 23/49827* (2013.01); *H01L 23/562* (2013.01); *H01L 2224/32225* (2013.01); *H01L 2224/48091* (2013.01); *H01L 2224/48227* (2013.01); *H01L 2224/73265* (2013.01); *H01L 2924/15174* (2013.01); *H01L 2924/15184* (2013.01); *H01L 2924/15311* (2013.01); *H01L 2924/16195* (2013.01); *H01L 2924/181* (2013.01)

(58) Field of Classification Search
CPC ............................... H01L 23/38; H01L 23/40
USPC .......... 257/675, 706, 717–720, 796; 438/121, 438/122
See application file for complete search history.

(56) References Cited

U.S. PATENT DOCUMENTS 5,583,377 A * 12/1996 Higgins ................... H01L 23/13
257/707
6,816,377 B2 * 11/2004 Itabashi ............... H05K 1/0206
361/704
(Continued)

FOREIGN PATENT DOCUMENTS

JP   H 07-283349 A   10/1995
JP   2006-191465 A   7/2006

*Primary Examiner* — Calvin Lee
(74) *Attorney, Agent, or Firm* — McGinn IP Law Group, PLLC

(57) ABSTRACT

An object of the present invention is to improve the reliability of a semiconductor device having an imaging function.

A semiconductor device includes a package having a cavity and terminals (TE1), a semiconductor chip that has an imaging unit and is arranged in the cavity, and a cap material with which the cavity is sealed and which has translucency. In addition, the semiconductor device includes a mounting board that has a through-hole and terminals (TE2) and is arranged so as to electrically couple the terminals (TE1) to the terminals (TE2), a heat transfer member that is inserted into the through-hole and is coupled to the package, and a heat sink coupled to the heat transfer member.

14 Claims, 14 Drawing Sheets

(51) Int. Cl.
    *H01L 23/40*    (2006.01)
    *H01L 23/38*    (2006.01)
    *H01L 23/36*    (2006.01)
    *H01L 23/498*   (2006.01)
    *H01L 23/055*   (2006.01)
    *H01L 23/10*        (2006.01)
    *H01L 23/00*        (2006.01)

(56) References Cited

U.S. PATENT DOCUMENTS 7,812,360 B2 * 10/2010 Yano ................... H01L 33/641
                                                              257/98
8,014,152 B2 *  9/2011 Nishiuma ........... H05K 7/20481
                                                              361/719
8,525,214 B2 *  9/2013 Lin ....................... H01L 21/486
                                                              257/99

* cited by examiner

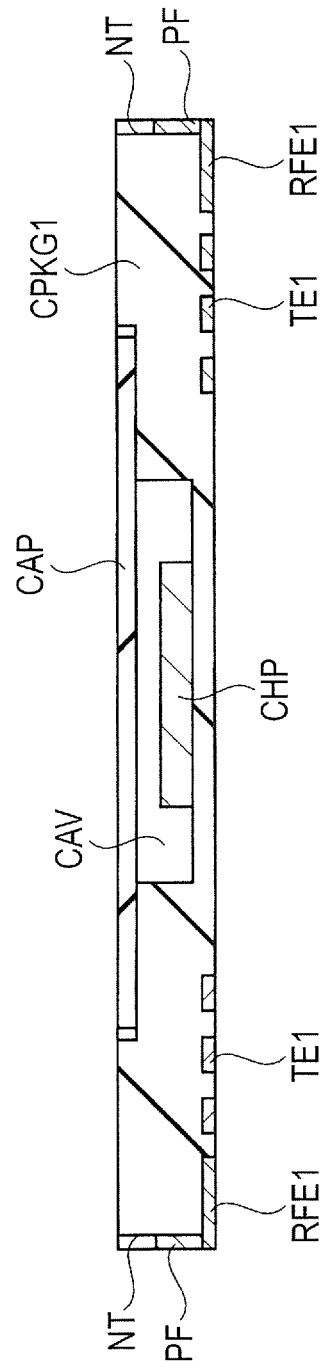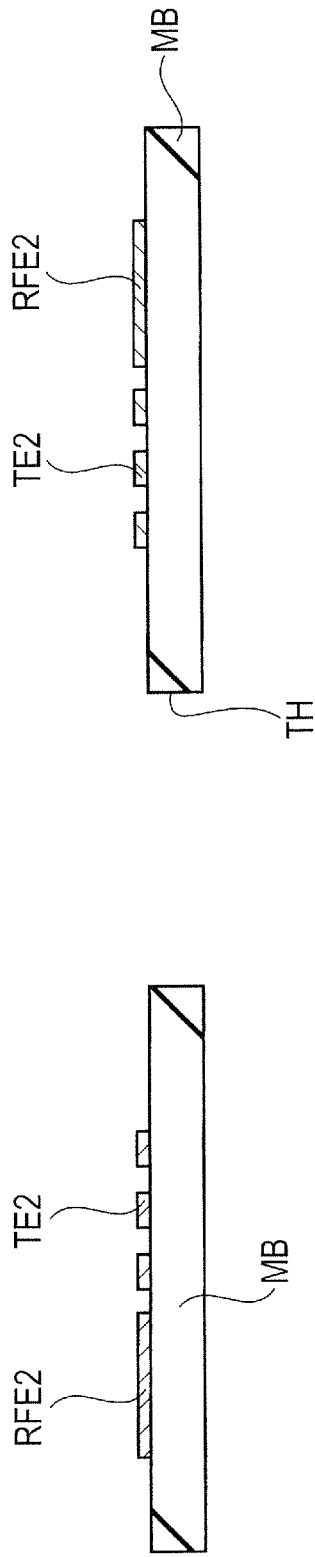

SEMICONDUCTOR DEVICE

CROSS-REFERENCE TO RELATED APPLICATIONS

The disclosure of Japanese patent application No. 2015-101542 filed on May 19, 2015 including the specification, drawings and abstract is incorporated herein by reference in its entirety.

BACKGROUND

The present invention relates to a semiconductor device, and for example, to a technique effective in application to a semiconductor device having an imaging unit that receives light.

Japanese Unexamined Patent Application Publication No. 2006-191465 describes a technique in which a heat sink is provided on the back surface of a signal processing device through a Peltier element in an electronic device in which a solid imaging element is laminated and arranged on the signal processing device.

Japanese Unexamined Patent Application Publication No. (Hei) 7 (1995)-283349 describes a technique in which a heat radiation block is attached to the lower surface side of a package in a semiconductor device in which it is difficult to attach the heat radiation block to the upper surface of the package.

SUMMARY

For example, a BGA (Ball Grid Array) is mainly used as a package structure of a semiconductor device, and is configured in such a manner that a semiconductor chip is mounted on a wiring board, pads formed on the top surface of the semiconductor chip and terminals formed on the upper surface of the wiring board are electrically coupled to each other through wires, the semiconductor chip is sealed with resin, and ball terminals are provided on the lower surface of the wiring board.

However, the flatness and heat radiation of the package structure are strictly required for a semiconductor device in which an imaging unit that receives light is provided on the top surface of the semiconductor chip as compared to a normal semiconductor device, and it is difficult for the BGA to satisfy the requirements. Namely, in order to improve the flatness and heat radiation of the package structure while securing the function of the imaging unit in the semiconductor device in which the imaging unit that receives light is provided on the top surface of the semiconductor chip, it is necessary to devise the package structure.

The other objects and novel characteristics will become apparent from the description of the specification and the accompanying drawings.

In a semiconductor device according to an embodiment, a semiconductor chip having an imaging unit is arranged in a cavity provided in an insulating base material, and the insulating base material is arranged on a mounting board. In addition, a through-hole is provided in the mounting board, a heat transfer member coupled to the insulating base material is inserted into the through-hole, and a heat radiation member coupled to the heat transfer member is provided on the lower surface side of the mounting board.

According to an embodiment, the reliability of a semiconductor device having an imaging function can be improved.

BRIEF DESCRIPTION OF THE DRAWINGS

FIG. 2 are schematic views each showing an exterior configuration of a semiconductor device in an embodiment.

FIG. 9 is a cross-sectional view for showing a cross section of the package in the embodiment;

FIG. 10 is a cross-sectional view for showing a cross section of the mounting board in the embodiment;

DETAILED DESCRIPTION

Figure 1:
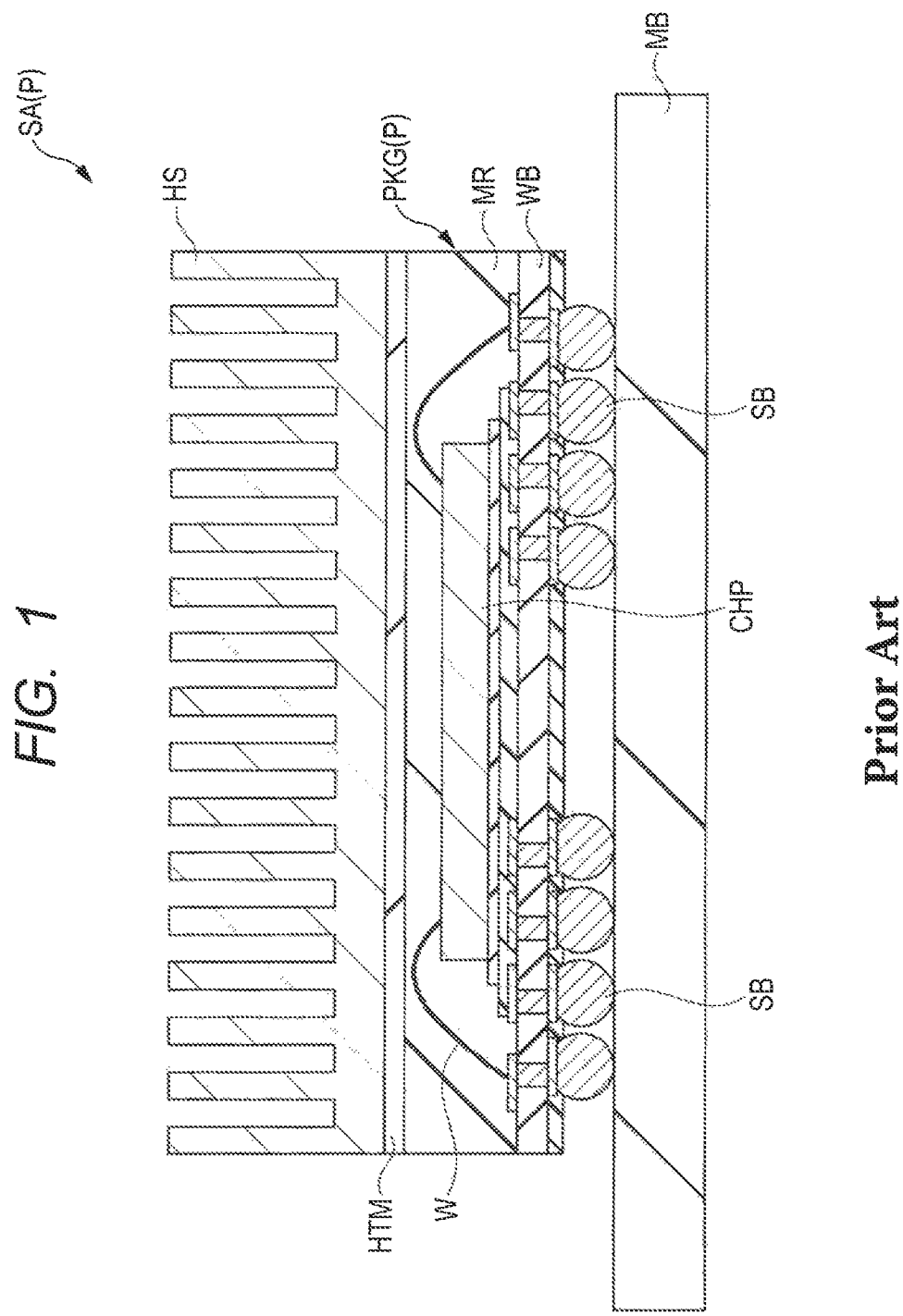
FIG. 1 is a cross-sectional view for showing a general semiconductor device whose package configuration is a BGA.

The present invention will be described using the following embodiment while being divided into a plurality of sections or embodiments if necessary for convenience sake. However, except for a case especially specified, the sections or embodiments are not irrelevant to each other, and one has a relationship with a part of a modified example or a complete modified example, or a detailed or supplementary explanation of the other.

Further, if the specification refers to the number of elements (including the number of pieces, values, amounts, ranges, and the like) in the following embodiment, the present invention is not limited to the specific number, but may be smaller or larger than the specific number, except for a case especially specified or a case obviously limited to the specific number in principle.

Furthermore, it is obvious that the components (including elemental steps and the like) are not necessarily essential in the following embodiment, except for a case especially specified or a case obviously deemed to be essential in principle.

As similar to the above, if the specification refers to the shapes or positional relationships of components in the following embodiment, the present invention includes those that are substantially close or similar to the components in shapes and the like, except for a case especially specified or a case obviously deemed not to be close or similar in principle. The same applies to the values and ranges.

Further, the same members are given the same reference numerals in principle in the all drawings for explaining the embodiment, and the repeated explanation thereof will be omitted. It should be noted that hatched lines are occasionally used even in the case of plan views in order to easily view the drawings.

The technical concept in the embodiment can be widely applied to a semiconductor device having an imaging function. As an example, an example of applying to a semiconductor device as a component of a holographic memory will be described.

<Principle of Holographic Memory>

With the use of "three-dimensional recording (volume recording)" in which even the thickness direction of a recording medium is used for recording and "parallel processing" by which two-dimensional sequence data can be collectively recorded and reproduced, a holographic memory can realize large capacity recording (up to Tbit/$cm^3$) and a high transfer rate (up to Gbps) that are difficult to realize in a conventional planar bit-type recording method.

The holographic memory includes, for example, a spatial light modulator that superposes two-dimensional data on signal light in addition to signal light and reference light, a lens used to focus light or to apply Fourier transform to light, and a photoreceiver (a semiconductor device having an imaging function) that receives wo-dimensional data.

When recording data into the holographic memory, the amplitude and phase of the signal light are modulated by the spatial light modulator in association with the two-dimensional data, the modulated signal light is allowed to enter the recording medium, and the reference light having no information is also allowed to enter the recording medium. In this case, interference fringes are formed due to interference between the signal light and the reference light in the recording medium, and a diffraction grating corresponding to the interference fringes is formed. The recording medium with the diffraction grating formed is the holography, thereby recording information.

On the other hand, when reproducing data from the holographic memory, the reference light used at the time of recording is used. Specifically, when the reference light enters the holography that is the recording medium with the diffraction grating formed, diffraction light (reproduction light) having a wavefront same as that of the original signal light is generated by the diffraction grating formed in the recording medium, and the original two-dimensional data can be read by receiving the diffraction light with the photoreceiver.

Such a holographic memory is advantageous in that different data can be recorded while being overlapped at the same position of a crystal in the recording medium and can be independently reproduced. This is referred to as multiplex recording in which a phenomenon unique to a thick hologram (volume hologram) referred to as Bragg diffraction is used.

For example, in a bit recording method as typified by a CD (Compact Disk) or a DVD (Digital Video Disk), each data is recorded into a local position of the recording medium. Namely, one storage area corresponds to one bit in the bit recording method.

On the contrary, one bit can be recorded across the entire area of the recording medium in the holographic memory.

Therefore, the holographic memory is advantageously less in data loss due to damage of a part of the recording medium as compared to the bit recording method. This is because information is recorded into the entire crystal of the recording medium as the diffraction grating corresponding to the interference fringes of the signal light and the reference light in the holographic memory, and the reproduction light appears as a result of interference of the diffraction light from the diffraction grating.

Here, a condition to determine whether or not the diffraction light generated in the diffraction grating spread in the entire crystal is suitably overlapped with the same phase when the reference light is irradiated onto the recording medium is referred to as a Bragg condition. In general, if the reference light in the states (the wavelength and incidence angle) same as those at the time of recording is used at the time of reproducing, the Bragg condition is automatically satisfied, and the signal light is diffracted. However, if the angle and wavelength of the reference light used at the time of recording are changed, the Bragg condition is not satisfied, and the signal light is not diffracted (reproduced). Accordingly, it can be understood that it is important that the incidence angle of the reference light at the time of reproducing matches that of the reference light at the time of recording in the holographic memory. Namely, the holographic memory requires high accuracy with which the incidence angle of the reference light at the time of reproducing matches that of the reference light at the time of recording.

Here, plural pieces of information can be recorded while being overlapped at the same part of the crystal (multiplex recording) by using the characteristics of the Bragg diffraction in the holographic memory. For example, when the first hologram is recorded while setting the incidence angle of the reference light at θ0, diffraction light intensity from the first hologram is dropped once to zero at a certain deviation amount (Δθ) relative to deviation from the incidence angle θ0 of the reference light. Namely, when the incidence angle of the reference light becomes θ0+Δθ, the information of the first hologram is not diffracted at all. Therefore, the second hologram is recorded in a state where the incidence angle of the reference light becomes θ0+Δθ, and thus the information of the second hologram can be recorded independently from the first hologram. Accordingly, if data of the m-th hologram is similarly recorded at an incidence angle of θ0+mΔθ of the reference light, the data can be recorded in a multiplex manner into the same area of the recording medium. For example, when the hologram is formed on the entire crystal having a thickness of 1 cm under the conditions that the wavelength is 532 nm and the angle formed by the signal light and the reference light is 90°, Δθ is 0.002°. Accordingly, since Δθ becomes a very small value, it is necessary to determine the incidence angle of the reference light with high accuracy, in particular, when the multiplex recording is performed in the holographic memory. In another point of view, high-accuracy flatness is required for a semiconductor device that receives the diffraction light from the hologram at the time of reproducing. Because in the case where the flatness of the semiconductor device that receives the diffraction light from the hologram varies even though the incidence angle of the reference light is determined with high accuracy, the variation is equivalent to that in the incidence angle of the reference light. Thus, for example, a deterioration in the flatness of the semiconductor device has an adverse effect on the reproduction of the holographic memory. Therefore, the high-accuracy flatness is required for the semiconductor device used as a photoreceiver of the holographic memory.

Accordingly, a package structure of a general semiconductor device is improved and devised so as to be suitable for use in a holographic memory in the embodiment.

Hereinafter, a study of improvement is conducted first in order to apply a general semiconductor device to a holographic memory, and then the semiconductor device devised on the basis of the study of improvement in the embodiment will be described.

<Study of Improvement>

FIG. 1 is a cross-sectional view for showing a general semiconductor device whose package configuration is a BGA. As shown in FIG. 1, a general semiconductor device SA(P) has a mounting board MB on which a package PKG(P) is mounted. The package PKG(P) has a wiring board WB, and solder balls SB are formed on the lower surface of the wiring board WB. In addition, terminals are formed on the upper surface of the wiring board WB, and a semiconductor chip CHP is mounted thereon. Further, pads of the semiconductor chip CHP are electrically coupled to the terminals through wires W. Furthermore, a sealing body MR made of resin is formed so as to cover the semiconductor chip CHP and the wires W in the package PKG(P), and a heat sink HS is mounted on the sealing body MR through a heat transfer member HTM.

There is a study matter 1 shown below when application of the semiconductor device SA(P) thus configured to a semiconductor device as a component of the holographic memory is considered.

For example, in the semiconductor device as a component of the holographic memory, the semiconductor chip arranged inside the semiconductor device has an imaging function. Specifically, an imaging unit that receives light is formed on the top surface side of the semiconductor chip CHP in FIG. 1. However, in the semiconductor device SA(P) shown in FIG. 1, the top surface of the semiconductor chip CHP is covered with the sealing body MR, and the heat sink HS is mounted above the semiconductor chip CHP. Thus, in the semiconductor device SA(P) shown in FIG. 1, light cannot enter the imaging unit formed on the top surface of the semiconductor chip CHP from the outside. Namely, in order to configure the semiconductor device SA(P) shown in FIG. 1 as a component of the holographic memory, first, the semiconductor device SA(P) needs to be devised in such a manner that light from the outside can enter the imaging unit formed on the top surface of the semiconductor chip CHP. This point corresponds to the study matter 1.

Next, in the package PKG(P) whose package configuration is the BGA, the solder balls SB are provided on the lower surface of the package PKG(P), and the package PKG(P) and the mounting board MB are coupled to each other through the solder balls SB. Here, the load of the package PKG(P) and the heat sink HS is applied to the solder balls SB through which the package PKG(P) and the mounting board MB are coupled to each other, and thus the solder balls SB are likely to be deformed. In other words, the solder balls SB are likely to be collapsed, and are collapsed in various ways. Thus, the package PKG(P) is likely to be inclined, and it is difficult to secure the high-accuracy flatness. Namely, the high-accuracy flatness is required for the semiconductor device as a component of the holographic memory as described above, but it is difficult to secure the high-accuracy flatness in the package PKG(P) of the BGA.

Further, in the package PKG(P) shown in FIG. 1, the sealing body MR is formed on the wiring board WB. In this case, the wiring board WB and the sealing body MR are formed of different materials, and thus the linear expansion coefficient of the wiring board WB is different from that of the sealing body MR (resin). As a result, the package PKG (P) is warped, and the flatness of the package PKG(P) is deteriorated. Specifically, in order to apply the semiconductor device as a component of the holographic memory, the high-accuracy flatness is required. However, in the semiconductor device SA(P) shown in FIG. 1, it is difficult to secure the high-accuracy flatness due to a first factor resulting from the solder balls SB and a second factor resulting from the difference between the linear expansion coefficients of the wiring board WB and the sealing body MR (resin). As a result, in order to apply the semiconductor device SA(P) shown in FIG. 1 as a component of the holographic memory, the semiconductor device SA(P) needs to be devised to overcome the first factor and the second factor. This point corresponds to a study matter 2.

As described above, in order to apply the semiconductor device SA(P) shown in FIG. 1 as a component of the holographic memory, it is necessary to improve the semiconductor device SA(P). In particular, it is necessary to devise the semiconductor device SA(P) in consideration of the above-described study matter 1 and study matter 2. Accordingly, in order to provide the semiconductor device suitable for application to the holographic memory, the semiconductor device is devised in the embodiment. Specifically, the semiconductor device in the embodiment is devised in consideration of the above-descried study matter 1 and study matter 2. Hereinafter, the semiconductor device devised in the embodiment will be described.

<Configuration of Semiconductor Device>

Figure 2B:
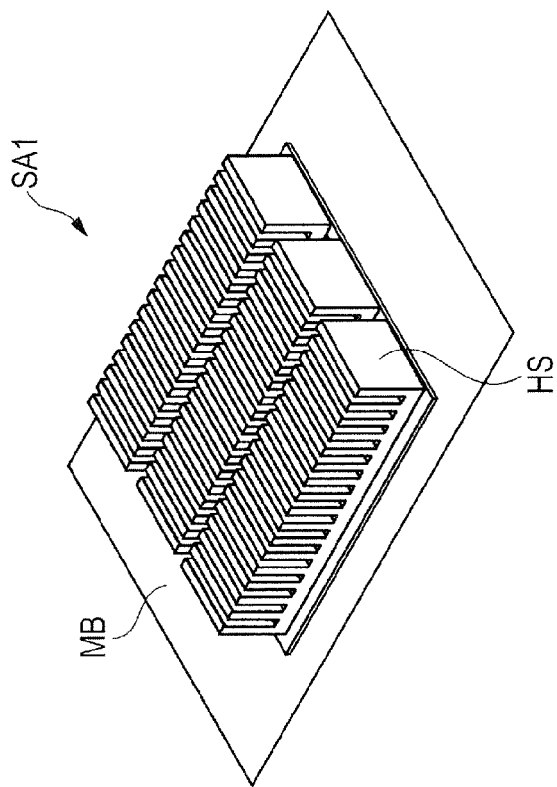
FIG. 2B is a diagram viewed from the lower surface side of the mounting board.
Figure 2A:
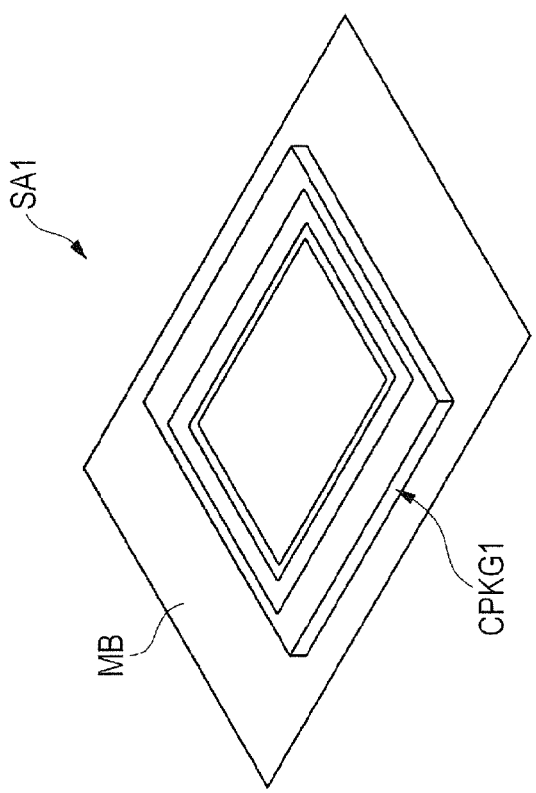
FIG. 2A is a diagram viewed from the upper surface side of a mounting board.

FIG. 2 are schematic views each showing an exterior configuration of a semiconductor device SA1 in the embodiment. In particular, FIG. 2A is a diagram viewed from the upper surface side of the mounting board MB, and FIG. 2B is a diagram viewed from the lower surface side of the mounting board MB. First, it can be understood as shown in FIG. 2A that a package CPKG1 having an imaging function is mounted on the upper surface side of the mounting board MB having a rectangular shape. On the other hand, it can be understood as shown in FIG. 2B that a heat sink (heat radiator) having a plurality of fins is arranged on the lower surface side of the mounting board MB. Namely, in the semiconductor device SA1 of the embodiment, the package CPKG1 and the heat sink HS are provided so as to sandwich the mounting board MB.

Figure 3:
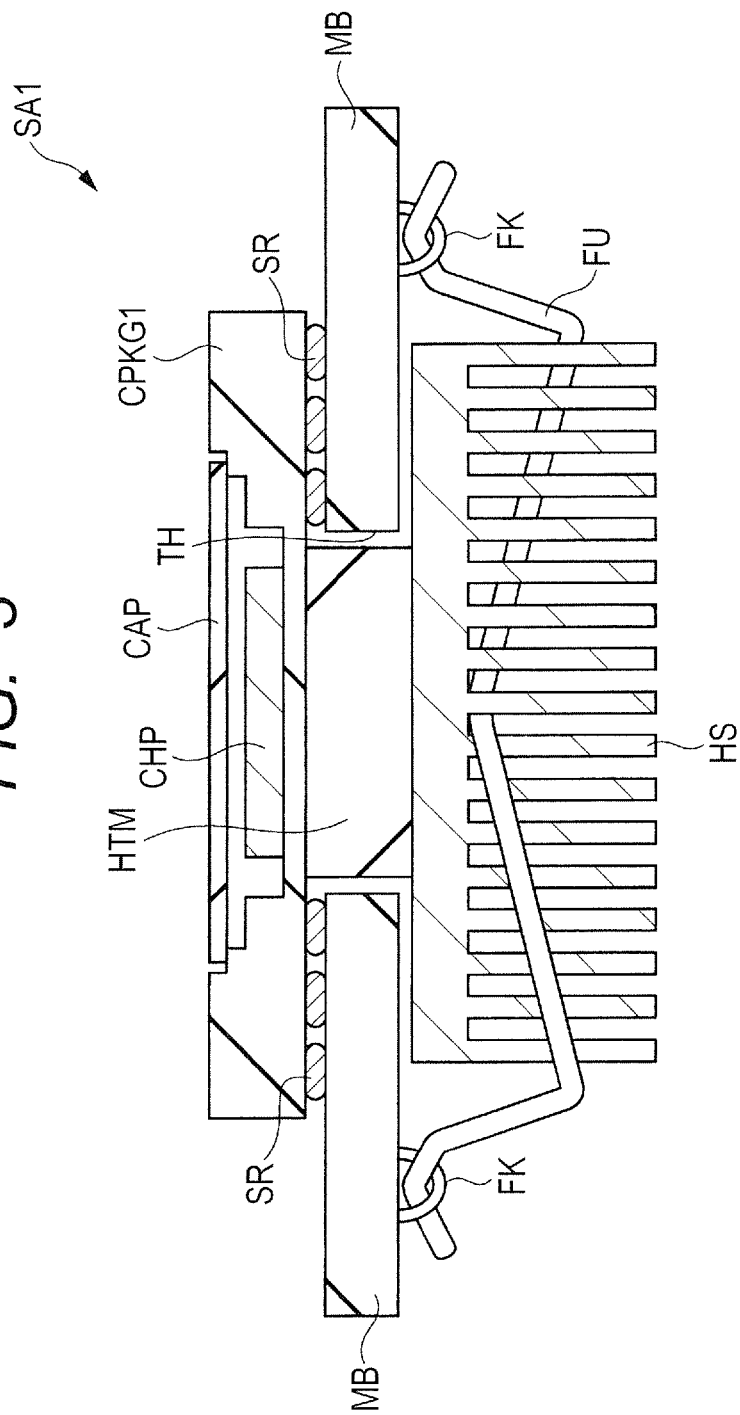
FIG. 3 is a cross-sectional view for showing a cross-sectional structure of the semiconductor device in the embodiment.

Next, FIG. 3 is a cross-sectional view for showing a cross-sectional structure of the semiconductor device SA1 in the embodiment. As shown in FIG. 3, a through-hole TH penetrating the mounting board MB in the thickness direction is formed in the middle section of the mounting board MB, and the package CPKG1 is arranged on the upper surface side of the mounting board MB. The package CPKG1 is electrically coupled to the mounting board MB through a plurality of solders SR. Specifically, although not illustrated in FIG. 3, a plurality of terminals is provided on the lower surface of the package CPKG1, and a plurality of terminals is also provided on the upper surface of the mounting board MB. Further, the terminals of the package CPKG1 are electrically coupled to those of the mounting board MB through the solders SR.

A semiconductor chip CHP having an imaging function is provided inside the package CPKG1, and an imaging unit having an imaging function is formed on the top surface side of the semiconductor chip CHP. Further, a cap material CAP having translucency is provided on the upper surface of the package CPKG1.

On the other hand, the heat sink HS as a heat radiating material is arranged on the lower surface side of the mounting board MB, and is mechanically fixed through a fixing member FU coupled to a pair of hooks FK fixed to the lower surface of the mounting board MB.

As described above, in the semiconductor device SA1 of the embodiment, the package CPKG1 is arranged on the upper surface side of the mounting board MB, whereas the heat sink HS is arranged on the lower surface side of the mounting board MB. Namely, in the semiconductor device SA1 of the embodiment, the package CPKG1 and the heat sink HS are arranged separately from each other so as to sandwich the mounting board MB. Further, as shown in FIG. 3, a heat transfer member HTM is inserted into the through-hole TH provided in the middle section of the mounting board MB, and the package CPKG1 and the heat sink HS are mechanically coupled to each other through the heat transfer member HTM.

Figure 4:
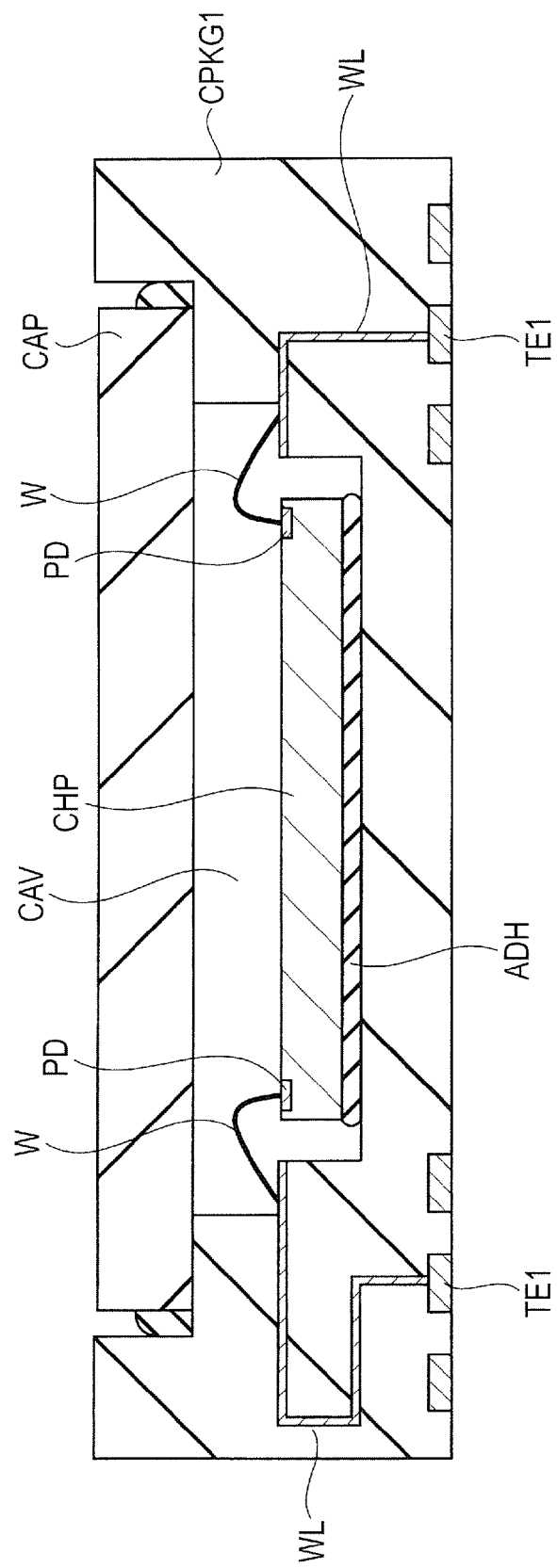
FIG. 4 is a cross-sectional view for showing an internal structure of a package.

The semiconductor device SA1 in the embodiment is configured as described above. Next, FIG. 4 is a cross-sectional view for showing an internal structure of the package CPKG1. In FIG. 4, the package CPKG1 in the embodiment has a cavity CAV on the upper surface side, and the semiconductor chip CHP is mounted on the bottom surface of the cavity CAV through an adhesive ADH. Further, the cavity in which the semiconductor chip CHP is arranged is sealed with the cap material CAP having translucency. Pads PD are formed on the top surface of the semiconductor chip CHP, and are electrically coupled to wirings WL provided in the package CPKG1 through wires W. Further, a plurality of terminals TE1 is formed on the lower surface of the package CPKG1, and is electrically coupled to the wirings WL provided in the package CPKG1. Thus, the semiconductor chip CHP is electrically coupled to the terminals TE1 formed on the lower surface of the package CPKG1 along the route of pads PD→wires W→wirings WL→terminals TE1. The package CPKG1 in the embodiment is configured as described above.

Namely, in the semiconductor device SA1 of the embodiment, the package CPKG1 is configured using an insulating base material on the upper surface side of which the cavity CAV is formed and on the lower surface of which the terminals TE1 are formed. In addition, the semiconductor chip CHP having the imaging unit on the top surface side is arranged in the cavity CAV. Further, the cavity CAV is sealed with the cap material CAP having translucency. Furthermore, in the semiconductor device SA1 of the embodiment, the through-hole TH penetrating in the thickness direction is formed, and the mounting board MB having the terminals on the upper surface is provided. The mounting board MB is arranged in such a manner that the terminals TE1 of the package CPKG1 are electrically coupled to the terminals of the mounting board MB through the solders SR while allowing the lower surface of the package CPKG1 to face the upper surface of the mounting board MB. Further, the heat transfer member HTM is inserted into the through-hole TH formed in the mounting board MB, and is arranged so as to come into contact with the insulating base material configuring the package CPKG1. On the other hand, the heat sink HS is provided on the lower surface side of the mounting board MB, and is fixed to the heat transfer member HTM so as to come into contact therewith. Specifically, the thickness of the heat transfer member HTM is larger than that of the mounting board MB, and the heat sink HS is mechanically fixed to the lower surface of the mounting board MB so as to come into contact with the heat transfer member HTM. For example, the pair of hooks FK diagonally fixed and arranged relative to the center of the heat sink HS is provided on the lower surface of the mounting board MB, and the heat sink HS is fixed through the fixing member FU that presses the heat sink HS against the heat transfer member HTM and that is coupled to the pair of hooks FK.

Characteristic in Embodiment

Next, characteristic points in the embodiment will be described. A first characteristic point in the embodiment realizes a configuration in which although the heat sink HS enhancing the heat radiation efficiency of heat generated in the semiconductor chip CHP is provided, light entering from the upper side of the semiconductor device SA1 can be received by the imaging unit formed on the top surface of the semiconductor chip CHP. Specifically, the first characteristic point in the embodiment is that as shown in, for example, FIG. 3, the package CPKG1 and the heat sink HS are arranged on the opposite sides of the mounting board MB, and the cap material CAP having translucency is provided on the upper surface of the package CPKG1. In other words, the first characteristic point in the embodiment is that the package CPKG1 including the semiconductor chip CHP having an imaging function is arranged on the upper surface side of the mounting board MB, the heat sink HS is arranged on the lower surface side of the mounting board MB, and the cap material CAP having translucency is provided on the upper surface of the package CPKG1. Therefore, according to the first characteristic point in the embodiment, the package CPKG1 and the heat sink HS are arranged separately from each other. As a result, light can enter the package CPKG1 from the upper side of the semiconductor device SA1 without being obstructed by the heat sink HS. Further, the cap material CAP having translucency is provided on the upper surface of the package CPKG1. Thus, light having entered the upper surface of the package CPKG1 passes through the cap material CAP having translucency, and then enters the top surface of the semiconductor chip CHP arranged inside the package CPKG1. In this case, since the imaging unit is formed on the top surface of the semiconductor chip CHP, the light having entered from the upper side of the semiconductor device SA1 can enter the imaging unit formed on the top surface of the semiconductor chip CHP according to the embodiment. Therefore, the semiconductor device SA1 in the embodiment can configure a data reading photoreceiver of the holographic memory.

Next, a second characteristic point in the embodiment is that as shown in, for example, FIG. 3, the through-hole TH is formed in the mounting board MB, and the package CPKG1 and the heat sink HS are coupled to each other through the heat transfer member HTM inserted into the through-hole TH. Accordingly, the heat generated in the semiconductor chip CHP arranged inside the package CPKG1 can be efficiently radiated. Namely, the heat generated in the semiconductor chip CHP is transferred from the bottom surface of the package CPKG1 to the heat transfer member HTM, and then is transferred from the heat transfer member HTM to the heat sink HS, followed by radiation to the outside. Therefore, according to the embodiment, while realizing the configuration in which the light entering from the upper side of the semiconductor device SA1 can be received by the imaging unit formed on the top surface of the semiconductor chip CHP in the first characteristic point, the heat generated in the semiconductor chip CHP can be radiated from the heat sink HS provided in the semiconductor device SA1 in the second characteristic point. As a result, according to the embodiment, the data reading photoreceiver of the holographic memory can be configured, and the heat radiation efficiency of the photoreceiver can be improved. Thus, a highly-reliable photoreceiver can be provided.

In particular, according to the second characteristic point in the embodiment, the heat transfer member HTM comes into contact with the bottom surface of the package CPKG1 and the heat sink HS as shown in FIG. 3. Therefore, the heat transfer efficiency from the package CPKG1 to the heat sink HS through the heat transfer member HTM can be improved. Namely, according to the second characteristic point in the embodiment, the heat radiation efficiency from the bottom surface of the package CPKG1 can be improved. Further, the semiconductor chip CHP is mounted, through the adhesive ADH, on the bottom surface of the cavity CAV formed in the package CPKG1 in FIG. 4, and thus the heat generated in the semiconductor chip CHP can be easily transferred from the bottom surface of the cavity CAV to the lower surface of the package CPKG1 through the adhesive ADH. In particular, the insulating base material configuring the package CPKG1 is configured using a ceramic board (32 W/m·K) with high heat conductivity in the embodiment, and thus the heat generated in the semiconductor chip CHP is efficiently transferred from the bottom surface of the cavity CAV to the lower surface of the package CPKG1 through the adhesive ADH.

As a result, according to the embodiment, the heat generated in the semiconductor chip CHP can be efficiently radiated to the outside along the heat radiation route of semiconductor chip CHP→adhesive ADH→bottom surface of package CPKG1→heat transfer member HTM→sink HS.

On the other hand, as shown FIG. 4, the semiconductor chip CHP is arranged in the cavity CAV in the package CPKG1 of the embodiment, and there exists a sealed space between the top surface of the semiconductor chip CHP and the cap material CAP. In this case, the material filled in the sealed space is a gas. Thus, the conductivity is low, and a heat insulation effect can be obtained. In particular, as the density (the pressure of the gas) of the material filled in the sealed space is smaller, the heat insulation effect can be enhanced. As described above, according to the second characteristic point in the embodiment, the heat can be suppressed from being radiated to the upper side of the semiconductor chip CHP by the sealed space that is high in the heat insulation effect. Namely, the heat generated in the semiconductor chip CHP is transferred from the inside of the cavity CAV to the cap material CAP, and is suppressed from being radiated from the upper surface side of the package CPKG1 due to the heat insulation effect in the cavity CAV. This means that the heat is suppressed from being radiated to the incidence side of light. Accordingly, it is possible to suppress a change in density due to the heat of the air (external atmosphere) existing on the outer side (the incidence side of light) of the upper surface of the package CPKG1. This means that the refractive index of the air (external atmosphere) existing on the outer side (the incidence side of light) of the upper surface of the package CPKG1 is suppressed from being changed. Accordingly, the fluctuation of the optical system caused by a change in the refractive index can be suppressed. As a result, the fluctuation of the incidence light caused by the fluctuation of the optical system can be suppressed, and the data reading accuracy as a data reading photoreceiver of the holographic memory can be improved.

As described above, according to the second characteristic point in the embodiment, it is possible to obtain a first advantage in which the heat radiation efficiency from the bottom surface of the package CPKG1 can be improved and a second advantage in which the heat can be suppressed from being radiated from the upper surface side of the package CPKG1. Accordingly, according to the second characteristic point in the embodiment, the temperature of the semiconductor device SA1 can be suppressed from rising in the first advantage, and the fluctuation of the incidence light can be suppressed in the second advantage. As a result, according to the second characteristic point in the embodiment, a highly-reliable photoreceiver can be provided as a data reading photoreceiver of the holographic memory.

It should be noted that as shown in, for example, FIG. 3, the through-hole TH is formed to have a width larger than that of the semiconductor chip CHP in cross section. In other words, the through-hole TH is formed to include the semiconductor chip CHP in planar view. Accordingly, according to the embodiment, the width of the heat transfer member HTM inserted into the through-hole TH is larger than that of the semiconductor chip CHP, and thus the heat generated in the semiconductor chip CHP can be efficiently transferred from the entire semiconductor chip CHP to the heat transfer member HTM. As a result, according to the embodiment, the heat radiation efficiency from the semiconductor chip CHP can be improved. However, it is not necessary to form the through-hole TH to have a width larger than that of the semiconductor chip CHP in cross section. It should be noted that in consideration of increasing heat generation in the imaging unit (a part of the semiconductor chip CHP) onto which the incidence light is irradiated, the through-hole TH is, at least, desirably formed to have a width larger than that of the imaging unit formed at a part of the semiconductor chip CHP in cross section. In other words, the through-hole TH is desirably formed to include the imaging unit in planar view. In this case, the width of the heat transfer member HTM inserted into the through-hole TH is larger than that of the imaging unit, and thus the heat radiation efficiency from the imaging unit can be improved.

Next, a third characteristic point in the embodiment is that as shown in, for example, FIG. 4, the package configuration of the package CPKG1 including the insulating base material, the semiconductor chip CHP, and the cap material CAP is configured using not the BGA but an LGA (Land Grid Array). Namely, as shown in FIG. 4, no solder balls are mounted on the terminals TE1 exposed from the bottom surface in the package CPKG1 of the embodiment. Accordingly, as shown in FIG. 3, the terminals of the package CPKG1 are electrically coupled to those of the mounting board MB through not the solder balls but the solders SR in the embodiment. Accordingly, the high-accuracy flatness can be secured in the package CPKG1 of the embodiment.

For example, in the package whose package configuration is the BGA, the solder balls are mounted on the lower surface of the package, and the package is coupled to the mounting board through the solder balls. In this case, the load of the package is applied to the solder balls through which the package is coupled to the mounting board, and thus the solder balls are likely to be deformed. In other words, the solder balls are likely to be collapsed, and are collapsed in various ways. Thus, the package is likely to be inclined, and it is difficult to secure the high-accuracy flatness. Namely, the high-accuracy flatness is required for the semiconductor device as a component of the holographic memory, but it is difficult to secure the high-accuracy flatness in the package whose configuration is the BGA.

On the contrary, as shown in FIG. 4, the package CPKG1 in the embodiment adopts the package configuration (LGA) in which no solder balls are mounted on the terminals TE1 exposed from the bottom surface. Accordingly, as shown in FIG. 3, not the solder balls but the solders SR (solder material) are used to couple the package CPKG1 to the mounting board MB in the embodiment. As a result, since no solder balls are originally used in the semiconductor device of the embodiment, it is not necessary to consider the deformation of the solder balls caused by the load of the package CPKG1, and thus a deterioration in the flatness of the package CPKG1 resulting from the variation in the collapse of the solder balls can be suppressed. Namely, according to the embodiment, the high-accuracy flatness of the package CPKG1 can be secured in the third characteristic point in which the LGA that uses no solder balls causing a deterioration in the flatness is adopted as the package configuration of the package CPKG1. Therefore, according to the third characteristic point in the embodiment, it is possible to obtain a remarkable effect in which the semiconductor device SA1 suitable for the holographic memory requiring the high-accuracy flatness can be provided.

Next, a fourth characteristic point in the embodiment is that as shown in, for example, FIG. 4, the insulating base material (case) configuring the package CPKG1 is configured using a single ceramic board. Accordingly, according to the embodiment, the warpage of the package CPKG1 can be suppressed, and thus the high-accuracy flatness can be secured in the package CPKG1. Accordingly, according to the fourth characteristic point in the embodiment, the flatness capable of enduring application to the holographic memory can be improved.

For example, a sealing body is formed on a wiring board in a normal resin-sealing package. In the case of the configuration, the wiring board and the sealing body are formed of different materials, and thus the linear expansion coefficient of the wiring board is different from that of the sealing body (resin). As a result, the package is warped and the flatness of the package is deteriorated by the heat applied to the package. Namely, the high-accuracy flatness is required for the package applied as a component of the holographic memory. However, it is difficult to secure the high-accuracy flatness due to the difference between the linear expansion coefficients of the wiring board and the sealing body in the resin-sealing package. Namely, it is difficult to apply to the holographic memory in the normal resin-sealing package.

On the contrary, instead of the resin-sealing package using the wiring board (interposer) and the sealing resin, the single ceramic board is used in the package CPKG1 of the embodiment. Specifically, in the package CPKG1 of the embodiment, as shown in, for example, FIG. 4, the cavity CAV is provided on the single ceramic board, the semiconductor chip CHP is arranged in the cavity CAV, and the cavity CAV is sealed with the cap material CAP. As described above, the package CPKG1 of the embodiment adopts the configuration (fourth characteristic point) in which instead of using the wiring board (interposer) and the sealing resin, the single ceramic board having the cavity CAV is used, and the cavity CAV is sealed with the cap material CAP. As a result, according to the package CPKG1 in the embodiment, the package is configured using not the materials such as the wiring board (interposer) and the sealing resin having different linear expansion coefficients, but the single ceramic board, and thus the warpage of the package caused by the difference between the linear expansion coefficients can be suppressed. Namely, according to the fourth characteristic point in the embodiment, generation of the warpage of the package CPKG1 can be suppressed in the configuration using the single ceramic board, and thus the package CPKG1 having the high-accuracy flatness can be provided.

As described above, the flatness of the package CPKG1 in the embodiment can be improved by a synergistic effect of the third characteristic point in which the LGA is used as a package configuration and the fourth characteristic point in which the single ceramic board is used. Namely, according to the embodiment, a deterioration in the flatness resulting from the collapse of the solder balls can be improved by the above-described third characteristic point, and a deterioration in the flatness resulting from the configuration in which the wiring board and the sealing resin having different linear expansion coefficients are used can be improved by the above-described fourth characteristic point. Accordingly, the high-accuracy flatness can be improved in the package CPKG1 of the embodiment, and thus the package suitable for application to the holographic memory can be provided.

The basic characteristic points of the embodiment include the above-described first to fourth characteristic points. However, on the basis of the above-described first to fourth characteristic points, the inventors studied further improvement from the viewpoint of improving the reliability of the semiconductor device. As a result, the semiconductor device in the embodiment further has the following characteristic points. Accordingly, the content of the study of further improvement will be described below, and then devised points (characteristic points) for the study of further improvement will be described.

<Study of Further Improvement>

As shown in, for example, FIG. 3, the through-hole TH is formed in the middle section of the mounting board MB in the semiconductor device SA1 of the embodiment. Therefore, when the package CPKG1 is coupled to the mounting board MB, it is difficult to use the entire lower surface of the package CPKG1 due to the through-hole TH posing an obstacle. Namely, in the semiconductor device SA1 of the embodiment, as shown in FIG. 3, when the package CPKG1 is coupled to the mounting board MB, not the middle section but only the peripheral section of the package CPKG1 is used. As a result, in the semiconductor device SA1 of the embodiment, the reliability of coupling the package CPKG1 to the mounting board MB is possibly deteriorated as compared to the configuration in which the entire lower surface of the package CPKG1 can be used to couple the package CPKG1 to the mounting board MB. This point is room for further improvement, and the semiconductor device is devised in the embodiment in consideration of the room for further improvement. Hereinafter, the devised points for the room for improvement will be described.

<Configuration 1 of Semiconductor Device>

Figure 5:
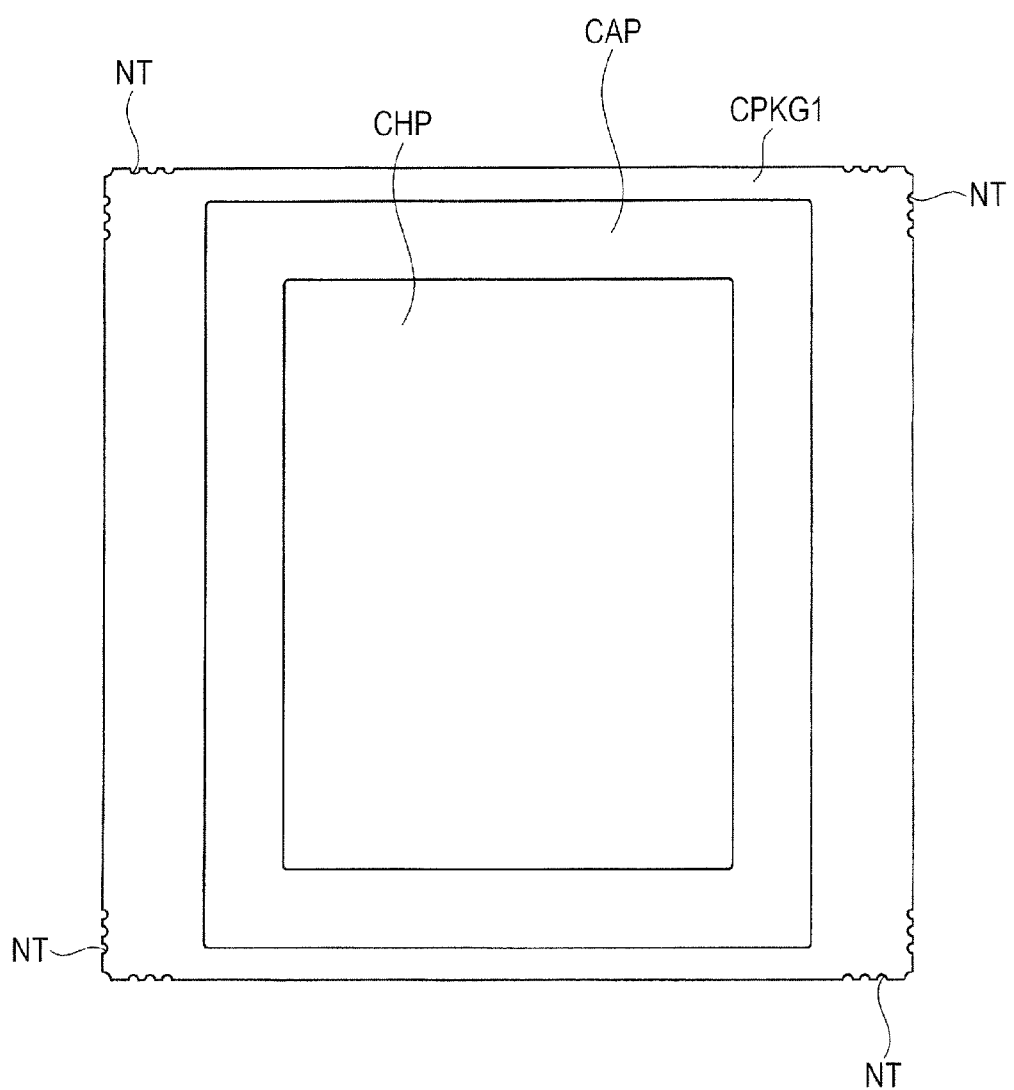
FIG. 5 is a top view of the package viewed from the upper surface in the embodiment.

FIG. 5 is a top view of the package CPKG1 viewed from the upper surface in the embodiment. As shown in FIG. 5, the package CPKG1 in the embodiment has a rectangular shape, and the semiconductor chip CHP is arranged inside the cavity provided in the middle section. Further, the cap material CAP is arranged so as to seal the cavity in which the semiconductor chip CHP is arranged. In this case, as shown in FIG. 5, a plurality of notch parts NT is formed around the corners of the package CPKG1 having a rectangular shape in the embodiment.

Figure 6:
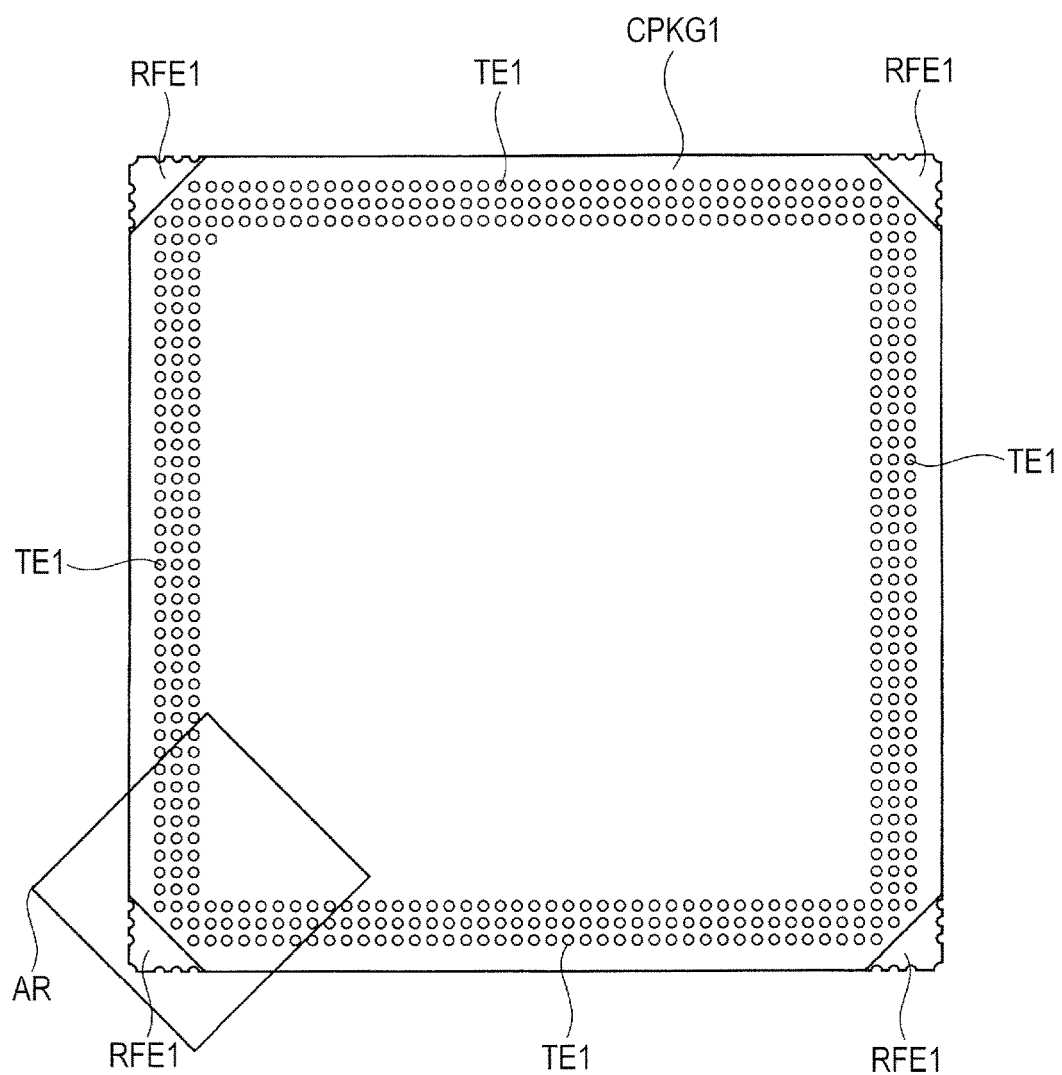
FIG. 6 is a bottom view of the package viewed from the lower surface in the embodiment.

Next, FIG. 6 is a bottom view of the package CPKG1 viewed from the lower surface in the embodiment. As shown in FIG. 6, the terminals TE1 are arranged at peripheral sections of the package CPKG1 in the embodiment. Further, reinforcing terminals RFE1 each having nearly a triangular shape are provided at the corners. Namely, the reinforcing terminals RFE1 are provided at outer positions relative to the positions where the terminals TE1 are arranged on the lower surface of the package CPKG1. Further, the planar size of each reinforcing terminal RFE1 is larger than that of each terminal TE1.

Figure 7:
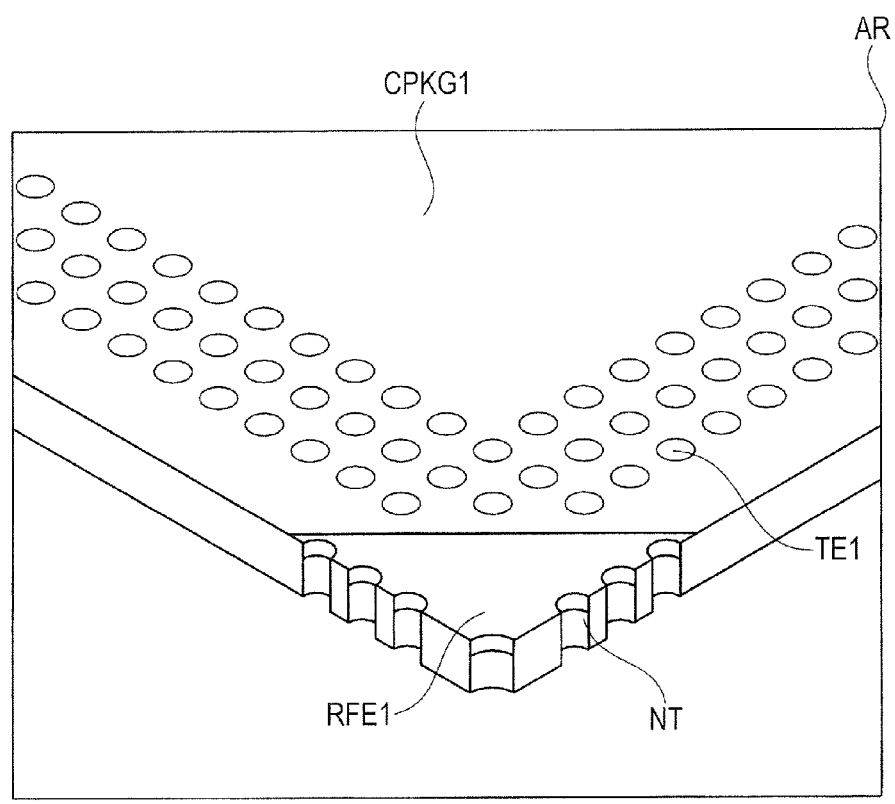
FIG. 7 is a schematic view obtained by enlarging an area of a part in FIG. 6.

Here, FIG. 7 is a schematic view obtained by enlarging an area AR of FIG. 6. As shown in FIG. 7, it can be understood that the notch parts NT are provided around the corner of the package CPKG1, and the reinforcing terminal RFE1 having nearly a triangular shape is formed.

Figure 8:
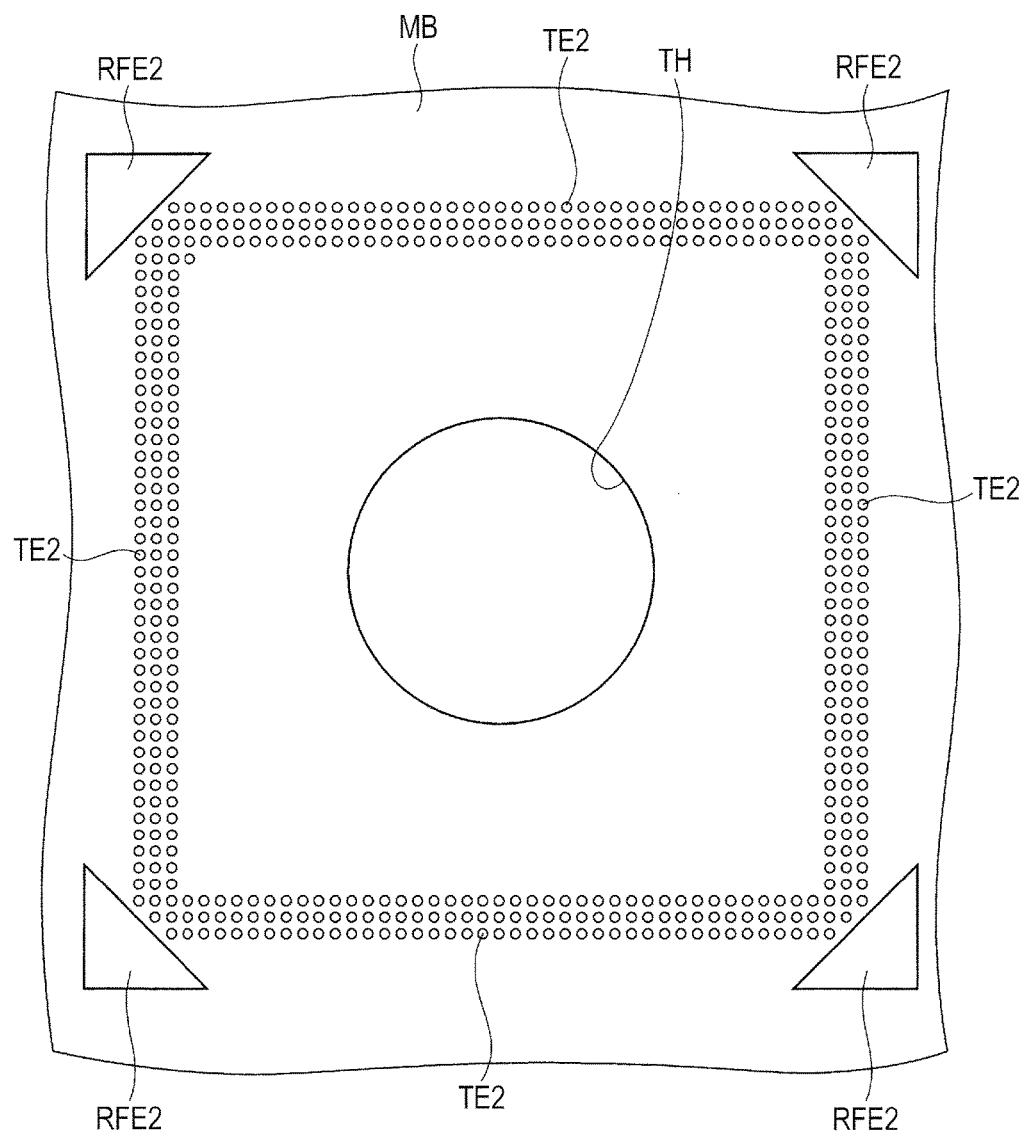
FIG. 8 is a top view of the mounting board viewed from the upper surface in the embodiment.

Next, FIG. 8 is a top view of the mounting board MB viewed from the upper surface in the embodiment. As shown in FIG. 8, the mounting board MB in the embodiment has the circular through-hole TH in the middle section, and a plurality of terminals TE2 is arranged at the peripheral sections so as to surround the through-hole TH. In other words, the through-hole TH is formed in the middle section so as to be surrounded by the terminals TE2 arranged at the peripheral sections. These terminals TE2 are provided while being associated with the terminals TE1 formed on the lower surface of the package CPKG1 shown in FIG. 6. When the package CPKG1 is coupled to the mounting board MB, the terminals TE1 and the terminals TE2 are arranged so as to be electrically coupled to each other. Further, as shown in FIG. 8, reinforcing terminals RFE2 are formed outside the terminals TE2 on the upper surface of the mounting board MB. The reinforcing terminals RFE2 are arranged so as to be electrically coupled to the reinforcing terminals RFE1 formed on the lower surface of the package CPKG1 when the package CPKG1 is coupled to the mounting board MB. Further, the planar size of each reinforcing terminal RFE2 is larger than that of each terminal TE2.

It should be noted that FIG. 8 shows an example in which the planar shape of the through-hole TH is circular, but the present invention is not limited to this. The planar shape of the through-hole TH may be rectangular or the like. However, the through-hole TH formed in the mounting board MB is a component used when the package CPKG1 and the heat sink HS are coupled to each other through the heat transfer member HTM, and the planar shape of the through-hole TH is desirably circular from the viewpoint of improving the coupling work.

FIG. 9 is a cross-sectional view for showing a cross section of the package CPKG1 in the embodiment. As shown in FIG. 9, the terminals TE1 and the reinforcing terminals RFE1 are formed on the lower surface of the package CPKG1 in the embodiment, and further the notch parts NT are formed on the side surfaces of the corners of the package CPKG1. In addition, a plating film PF is formed at a part of the inner wall of each notch part NT.

Next, FIG. 10 is a cross-sectional view for showing a cross section of the mounting board MB in the embodiment. As shown in FIG. 10, the terminals TE2 and the reinforcing terminals RFE2 are formed at the peripheral sections on the upper surface of the mounting board MB in the embodiment. On the other hand, the through-hole TH penetrating the mounting board MB in the thickness direction is formed in the middle section.

Figure 11:
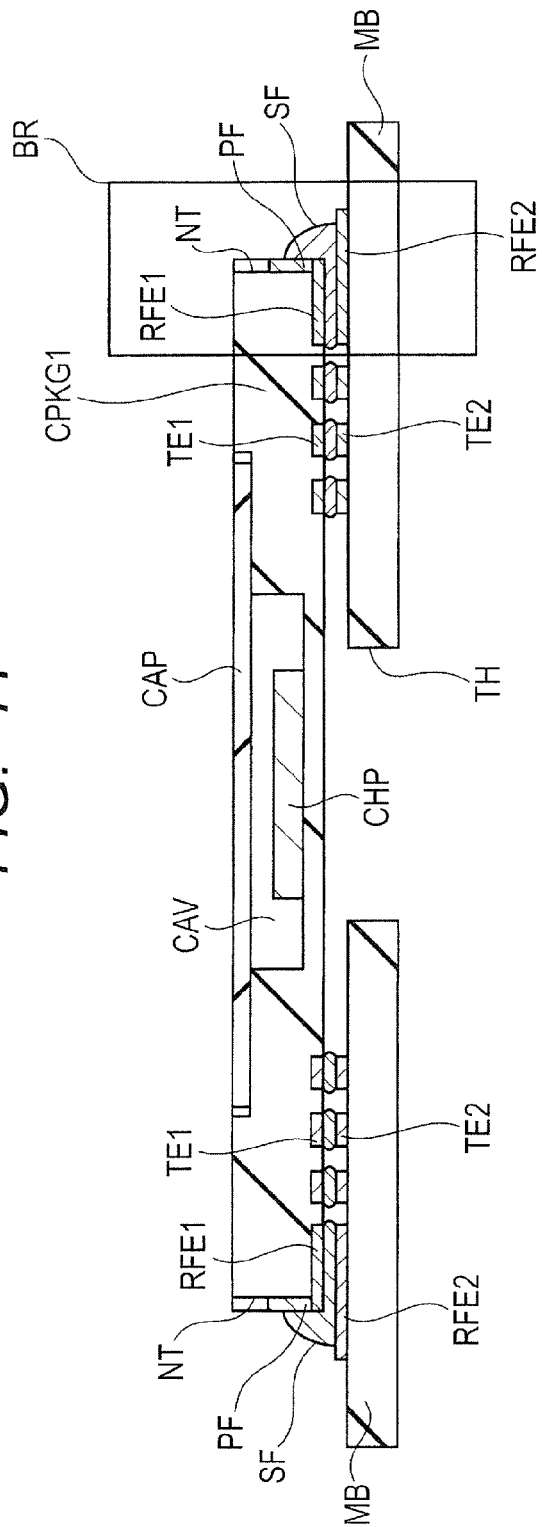
FIG. 11 is a cross-sectional view for showing a state in which the package shown in FIG. 9 is mounted on the mounting board shown in FIG. 10.

Next, FIG. 11 is a cross-sectional view for showing a state in which the package CPKG1 shown in FIG. 9 is mounted on the mounting board MB shown in FIG. 10. As shown in FIG. 11, the package CPKG1 is mounted on the upper surface of the mounting board MB. In this case, each of the terminals TE1 formed on the lower surface of the package PCPKG1 is electrically coupled to each of the terminals TE2 formed on the upper surface of the mounting board MB through a solder material. As similar to the above, each of the reinforcing terminals RFE1 formed on the lower surface of the package CPKG1 is electrically coupled to each of the reinforcing terminals RFE2 formed on the upper surface of the mounting board MB through a solder material. Here, as shown in FIG. 11, the size of each reinforcing terminal RFE2 is larger than that of each reinforcing terminal RFE1, and a part of each reinforcing terminal RFE2 is exposed from the package CPKG1 in cross section. As a result, as shown in FIG. 11, solder fillets SF are formed so as to creep up to the side surfaces of the package CPKG1 from between the reinforcing terminals RFE1 and the reinforcing terminals RFE2.

Figure 12:
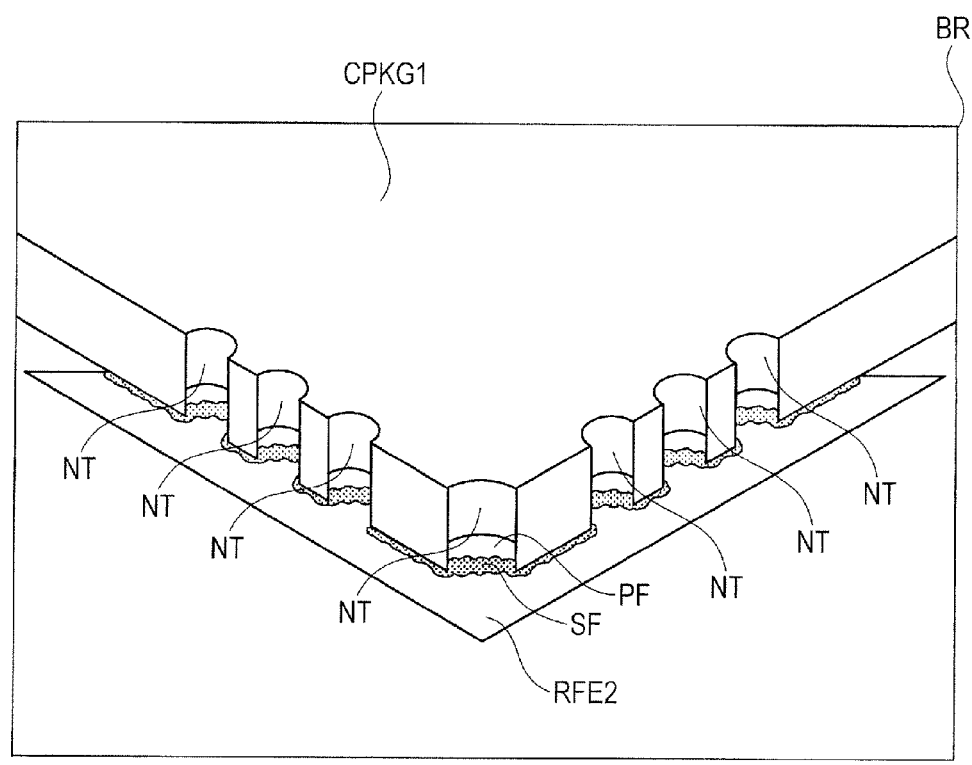
FIG. 12 is a diagram obtained by enlarging an area of a part in FIG. 11.

FIG. 12 is a diagram obtained by enlarging an area BR of FIG. 11. As shown in FIG. 12, the notch parts NT are formed around the corner of the package CPKG1, and the plating film PF is formed at a part of the inner wall of each notch part NT. Further, it can be understood that a part of each reinforcing terminal RFE2 formed on the upper surface of the mounting board is exposed from the package CPKG1, and the solder fillet SF is formed at a part of the inner wall of each notch part NT.

<Characteristic 1 in Embodiment>

Next, other characteristic points in the embodiment will be described. A fifth characteristic point in the embodiment is that, for example, the reinforcing terminals RFE1 are provided at the corners of the lower surface of the package CPKG1 shown in FIG. 6, and the reinforcing terminals RFE2 are provided on the upper surface of the mounting board MB shown in FIG. 8. Accordingly, as shown in FIG. 11, when the package CPKG1 is coupled to the mounting board MB, the terminals TE1 are coupled to the terminals TE2, and further the reinforcing terminals RFE1 are coupled to the reinforcing terminals RFE2. As a result, according to the fifth characteristic point in the embodiment, the coupling strength between the package CPKG1 and the mounting board MB can be improved, and the reliability of the semiconductor device SA1 in the embodiment can be accordingly improved.

As shown in FIG. 11, the through-hole TH is formed in the middle section of the mounting board MB in the semiconductor device SA1 of the embodiment. Thus, when the package CPKG1 is coupled to the mounting board MB, it is difficult to use the entire lower surface of the package CPKG1 due to the through-hole TH posing an obstacle. As a result, the package CPKG1 is coupled to the mounting board MB only at the peripheral sections of the lower surface of the package CPKG1 in the semiconductor device SA1 of the embodiment. Thus, the coupling reliability between the package CPKG1 and the mounting board MB is possibly deteriorated as compared to the configuration in which the entire lower surface of the package CPKG1 can be used for coupling the package CPKG1 to the mounting board MB.

Regarding this point, the reinforcing terminals RFE1 are provided at the corners of the lower surface of the package CPKG1, and the reinforcing terminals RFE2 are provided on the upper surface of the mounting board MB in the embodiment (fifth characteristic point). Accordingly, as shown in FIG. 11, when the package CPKG1 is coupled to the mounting board MB, the terminals TE1 are coupled to the terminals TE2, and further the reinforcing terminals RFE1 are coupled to the reinforcing terminals RFE2. Accordingly, according to the fifth characteristic point in the embodiment, the coupling strength between the package CPKG1 and the mounting board MB can be improved. Namely, the coupling reliability between the package CPKG1 and the mounting board MB can be improved in the configuration of the embodiment in which the middle section of the mounting board MB cannot be used to couple the mounting board MB to the package CPKG1 due to the through-hole TH provided in the middle section of the mounting board MB.

In particular, the size of each reinforcing terminal RFE1 is larger than that of each terminal TE1, and the size of each reinforcing terminal RFE2 is larger than that of each terminal TE2 in the embodiment. Therefore, the coupling strength between the reinforcing terminals RFE1 and the reinforcing terminals RFE2 is larger than that between the terminals TE1 and the terminals TE2. Thus, the coupling strength between the package CPKG1 and the mounting board MB can be considerably improved by additionally coupling the reinforcing terminals RFE1 to the reinforcing terminals RFE2 while providing the through-hole TH in the mounting board MB in the embodiment.

Further, the package CPKG1 and the mounting board MB are easily separated from each other, in particular, around the corners of the package CPKG1. Thus, it can be understood that the configuration in which the reinforcing terminals RFE1 are provided around the corners of the package CPKG1 is useful from the viewpoint of improving the coupling strength between the package CPKG1 and the mounting board MB.

It should be noted that the distance between each terminal TE1 and each reinforcing terminal RFE1 is larger than the pitch between the terminals TE1 in the package CPKG1 of the embodiment. Accordingly, according to the embodiment, a short circuit failure between the terminals TE1 and the reinforcing terminals RFE1 can be suppressed while providing the reinforcing terminals RFE1 outside the terminals TE1. As similar to the above, the distance between each terminal TE2 and each reinforcing terminal RFE2 is larger than the pitch between the terminals TE2 in the mounting board MB of the embodiment. Accordingly, according to the embodiment, a short circuit failure between the terminals TE2 and the reinforcing terminals RFE2 can be suppressed while providing the reinforcing terminals RFE2 outside the terminals TE2.

Next, a sixth characteristic point in the embodiment is that as shown in, for example, FIG. 7 and FIG. 11, the notch parts NT are formed on the side surfaces of the corners of the package CPKG1, and the plating film PF is formed at, at least, a part of the inner wall of each notch part NT. In the specification, the configuration of the sixth characteristic point is occasionally referred to as a "CLCC (Ceramic Leaded Chip Carrie) structure".

The "CLCC structure" has a function of improving the wettability of the solders by forming the plating film (Au film) at apart of the inner wall of each notch part NT, and the solder fillets SF are formed by the function of the "CLCC structure" in such a manner that the solders creep up to the side surfaces of the package CPKG1 as shown in FIG. 11. Accordingly, according to the embodiment, the coupling strength between the package CPKG1 and the mounting board MB can be further improved by the solder fillets formed by the "CLCC structure".

In particular, as shown in FIG. 11, the reinforcing terminals RFE2 formed on the upper surface of the mounting board MB are configured to be exposed from ends of the package CPKG1 in the embodiment. As a result, the solder fillets SF can be easily formed by a synergistic effect of the point in which the solder materials are formed even outside the package CPKG1 and the point in which the wettability of the solders is improved by the "CLCC structure" that is the sixth characteristic point in the embodiment. Namely, the coupling reliability between the package CPKG1 and the mounting board MB can be considerably improved by a combination of the fifth characteristic point and the sixth characteristic point in the embodiment.

<Configuration 2 of Semiconductor Device>

In the embodiment, the semiconductor device is further devised from the viewpoint of improving the coupling reliability between the package CPKG1 and the mounting board MB. Thus, this point will be described below.

Figure 13:
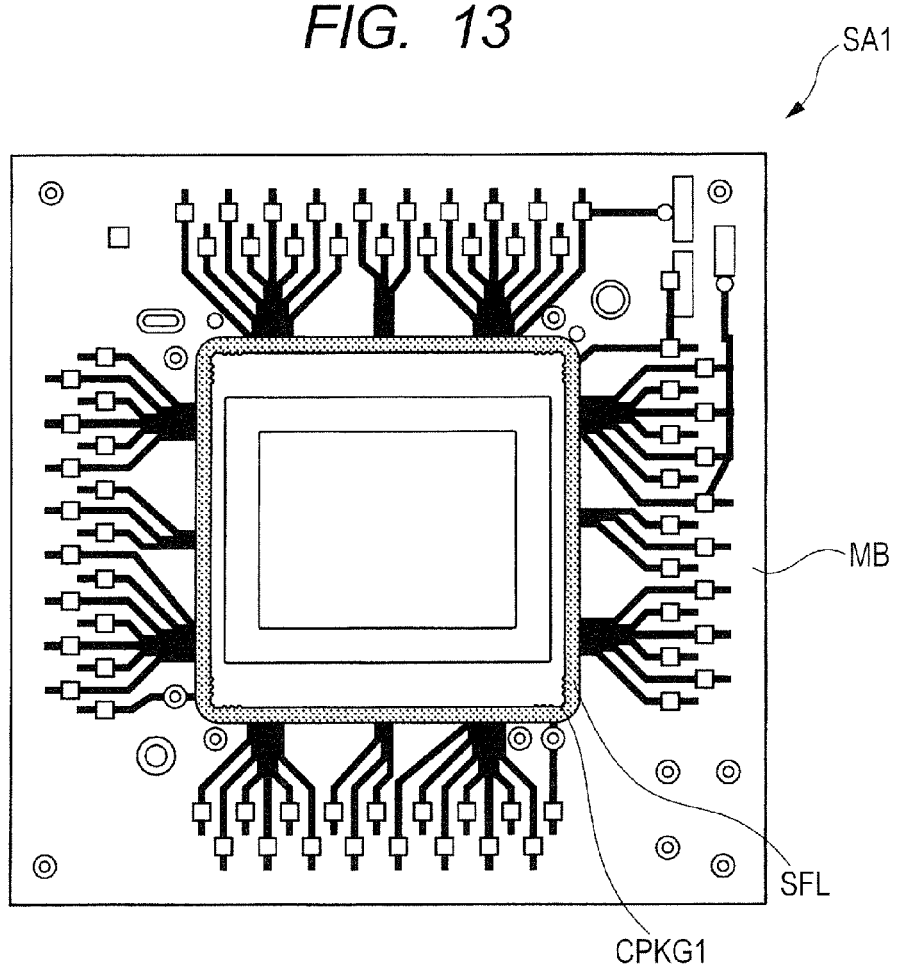
FIG. 13 is a plan view for showing a planar configuration of the semiconductor device in the embodiment.

FIG. 13 is a plan view for showing a planar configuration of the semiconductor device SA1 in the embodiment. As shown in FIG. 13, in the semiconductor device SA1 of the embodiment, the package CPKG1 is mounted on the upper surface of the mounting board MB, and a side fill SFL made of, for example, thermosetting resin is formed from a part of the upper surface of the mounting board MB to a part of the side surface of the package CPKG1.

Figure 14:
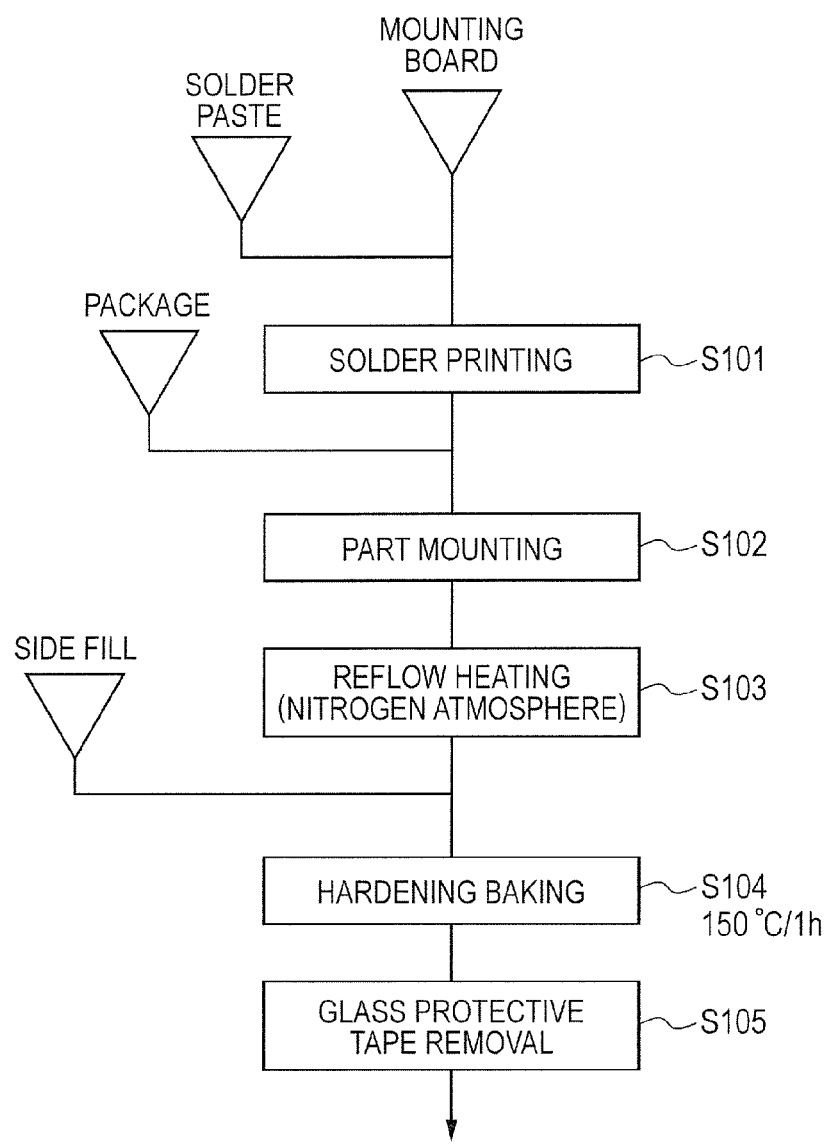
FIG. 14 is a flowchart for showing a flow of a manufacturing process of the semiconductor device in the embodiment.

FIG. 14 is a flowchart for showing a flow of a manufacturing process of the semiconductor device in the embodiment. In FIG. 14, a solder paste is first printed on the mounting board (solder printing S101), and then the package is mounted on the mounting board (part mounting S102). Thereafter, reflow heating is conducted in a nitrogen atmosphere (S103), and then the side fill made of, for example, thermosetting resin is applied from a part of the upper surface of the mounting board to a part of the side surface of the package. Next, hardening baking is conducted, for example, for about one hour at 150° C. to harden the applied side fill (S104). Thereafter, a glass protective tape is removed (S105), and the semiconductor device in the embodiment can be accordingly manufactured.

Figure 15A:
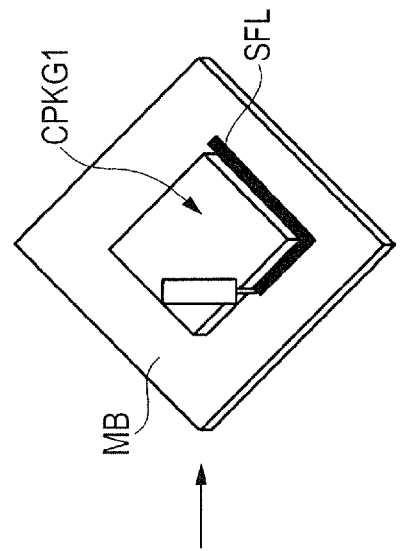
FIGS. 15A to 15C are diagrams each schematically showing a process in which a side fill is applied from a part of the upper surface of the mounting board to a part of the side surface of the package.
Figure 15B:
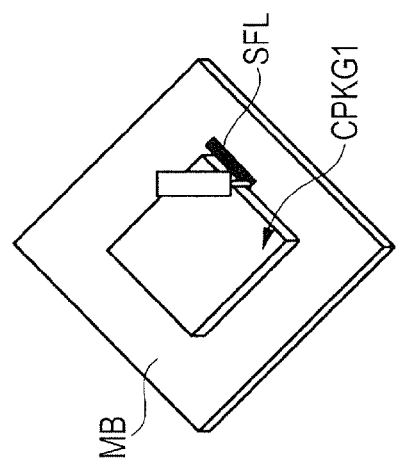
Figure 15C:
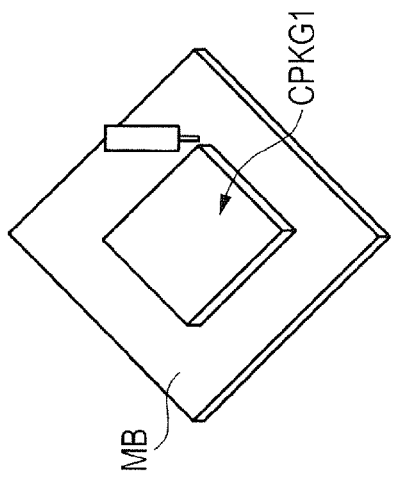

Specifically, FIGS. 15A to 15C are diagrams each schematically showing a process in which the side fill is applied from a part of the upper surface of the mounting board to a part of the side surface of the package. First, as shown in FIG. 15A, the package CPKG1 is mounted on the mounting board MB, and then, as shown in FIGS. 15B and 15C, the side fill SFL is applied from a part of the upper surface of the mounting board MB to a part of the side surface of the package CPKG1. As described above, the side fill SFL can be formed so as to surround the package CPKG1.

<Characteristic 2 in Embodiment>

As described above, a seventh characteristic point in the embodiment is that as shown in, for example, FIG. 13, the side fill SFL is formed from a part of the upper surface of the mounting board MB to a part of the side surface of the package CPKG1. Accordingly, according to the embodiment, fixing of the package CPKG1 to the mounting board MB is reinforced by the side fill SFL. As a result, the coupling reliability between the package CPKG1 and the mounting board MB can be improved.

In particular, in order to improve the coupling reliability between the package CPKG1 and the mounting board MB, the above-described fifth characteristic point, sixth characteristic point, and seventh characteristic point are provided in the embodiment. The coupling reliability between the package CPKG1 and the mounting board MB can be improved by each characteristic point, and more significant improvement in the coupling reliability can be realized by an organic synergistic effect of the fifth characteristic point, the sixth characteristic point, and the seventh characteristic point. As described above, according to the semiconductor device in the embodiment, the reliability can be improved. As a result, the long life of the semiconductor device can be realized.

<Another Characteristic>

Another characteristic in the embodiment is that as shown in FIG. 3, the thickness of the heat transfer member HTM having elasticity is larger than that of the mounting board MB, and the heat sink HS is mechanically fixed to the heat transfer member HTM so as to be pressed against the same by the fixing member FU coupled to the hooks FK. Accordingly, the heat radiation efficiency from the heat sink HS through the heat transfer member HTM can be improved, and stress generated in the semiconductor device can be absorbed by the elasticity of the heat transfer member HTM.

For example, it is conceivable that the heat sink HS is fixed to the lower surface of the mounting board MB using an adhesive. However, in the case where the heat transfer member HTM is contracted, a gap is generated between the heat transfer member HTM and the heat sink HS, and the heat transfer efficiency from the heat transfer member HTM to the heat sink HS is possibly deteriorated in the fixing method. Further, the adhesive through which the heat sink HS adheres to the mounting board MB is possibly deteriorated with the lapse of long time due to the heat radiation from the semiconductor device. With regard to this point, the thickness of the heat transfer member HTM having elasticity is larger than that of the mounting board MB, and the heat sink HS is mechanically fixed to the heat transfer member HTM so as to be pressed against the same by the fixing member FU coupled to the hooks FK in the embodiment. Therefore, even if the heat transfer member HTM is contracted, the heat sink HS is mechanically fixed to the heat transfer member HTM so as to be pressed against the same. Thus, the heat transfer member HTM and the heat sink HS are hardly separated from each other, and stable contact between the heat transfer member HTM and the heat sink HS can be secured. Accordingly, according to the embodiment, the contact between the heat transfer member HTM and the heat sink HS is stabilized. As a result, the heat transfer efficiency from the heat transfer member HTM to the heat sink HS can be stably improved. Further, according to the embodiment, it is not necessary to consider the deterioration of the adhesive due to the heat because no adhesive is used. From this point, the contact between the heat transfer member HTM and the heat sink HS is stabilized. As described above, according to the embodiment, the heat from the semiconductor device SA1 can be efficiently and stably radiated for a long period of time.

It should be noted that in the case of the above-described configuration, the heat sink HS is pressed against the heat transfer member HTM in FIG. 3. As a result, force (upward force) in the direction where the coupled part between the package CPKG1 and the mounting board MB is peeled off is applied to the coupled part. Therefore, in the configuration of the semiconductor device SA1 in the embodiment, the "peeling force" caused by the heat sink HS being pressed against the heat transfer member HTM exists in addition to the circumstances described in the section of "<study of further improvement>". Therefore, the necessity of improving the coupling strength between the package CPKG1 and the mounting board MB is increased. With regard to this point, the countermeasure of considerably improving the coupling strength between the package CPKG1 and the mounting board MB is taken by the above-described fifth characteristic point, sixth characteristic point, and seventh characteristic point in the embodiment. Accordingly, the deterioration in the coupling strength between the package CPKG1 and the mounting board MB caused by the above-described circumstances is not actualized. According to the embodiment, the coupling reliability between the package CPKG1 and the mounting board MB is considerably improved.

The invention achieved by the inventors has been concretely described above on the basis of the embodiment. However, it is obvious that the present invention is not limited to the embodiment, but can be variously changed without departing from the scope of the invention.

What is claimed is:

1. A semiconductor device comprising:
an insulating base material having a first upper surface and a first lower surface positioned on the opposite side of the first upper surface, a cavity on the first upper surface, and first terminals on the first lower surface;
a semiconductor chip having a first top surface and a first back surface positioned on the opposite side of the first top surface, and an imaging unit on the first top surface side, and arranged in the cavity;
a cap member sealing the cavity and having translucency;
a mounting board having a second upper surface and a second lower surface positioned on the opposite side of the second upper surface, a through-hole, and second terminals on the second upper surface, and arranged in such a manner that the first terminals and the second terminals are electrically coupled to each other while allowing the first lower surface of the insulating base material to face the second upper surface;
a heat transfer member inserted into the through-hole, and coupled to the insulating base material; and
a heat radiation member arranged on the second lower surface side of the mounting board, and coupled to the heat transfer member,
wherein first reinforcing terminals are provided at positions outside the arranged positions of the first terminals on the first lower surface of the insulating base material, and
wherein second reinforcing terminals are provided at positions outside the arranged positions of the second terminals on the second lower surface of the mounting board.

2. The semiconductor device according to claim 1, wherein the width of the through-hole is larger than that of the imaging unit in cross section.

3. The semiconductor device according to claim 1, wherein the width of the through-hole is larger than that of the semiconductor chip in cross section.

4. The semiconductor device according to claim 1, wherein the first terminals are present,
wherein the second terminals are present, and
wherein the second terminals surround the through-hole in planar view.

5. The semiconductor device according to claim 1, wherein the thickness of the heat transfer member is larger than that of the mounting board.

6. The semiconductor device according to claim 1, wherein the insulating base material is a ceramic board.

7. The semiconductor device according to claim 1, wherein a package structure including the insulating base material, the semiconductor chip, and the cap member is an LGA.

8. The semiconductor device according to claim 1, wherein the size of each second reinforcing terminal is larger than that of each second terminal.

9. The semiconductor device according to claim 1, wherein the size of each second reinforcing terminal is larger than that of each first reinforcing terminal, and wherein a part of each second reinforcing terminal is exposed from the insulating base material in cross section.

10. The semiconductor device according to claim 1, wherein a side fill is formed from a part of the second upper surface of the mounting board to a part of the side surface of the insulating base material.

11. The semiconductor device according to claim 1, wherein the heat radiation member is mechanically fixed to the second lower surface of the mounting board.

12. The semiconductor device according to claim 11, wherein a pair of hooks diagonally fixed and arranged relative to the center of the heat radiation member is provided on the second lower surface of the mounting board, and
wherein the heat radiation member is fixed by a fixing member that presses the heat radiation member against the heat transfer member and is coupled to the pair of hooks.

13. The semiconductor device according to claim 1, wherein notch parts coupled to the first reinforcing terminals are provided on side surfaces of the insulating base material, and
wherein a conductive film is formed at, at least, a part of the inner wall of each notch part.

14. The semiconductor device according to claim 13, wherein a solder fillet is formed at, at least, a part of the inner wall of each notch part.

* * * * *